(12) United States Patent
Cohen et al.

(10) Patent No.: US 7,014,887 B1
(45) Date of Patent: Mar. 21, 2006

(54) SEQUENTIAL SPUTTER AND REACTIVE PRECLEANS OF VIAS AND CONTACTS

(75) Inventors: Barney M. Cohen, Santa Clara, CA (US); Suraj Rengarajan, Sunnyvale, CA (US); Xiangbing Li, San Jose, CA (US); Kenny King-Tai Ngan, Fremont, CA (US); Peijun Ding, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 550 days.

(21) Appl. No.: 09/388,989

(22) Filed: Sep. 2, 1999

(51) Int. Cl.
*B05D 3/06* (2006.01)
*B08B 7/00* (2006.01)
*C23C 14/02* (2006.01)
*H05H 1/46* (2006.01)
*H01L 21/3205* (2006.01)

(52) U.S. Cl. .................. 427/534; 427/537; 134/1.1; 134/1.2; 438/637; 438/653

(58) Field of Classification Search .............. 427/534, 427/536, 537

See application file for complete search history.

(56) References Cited

U.S. PATENT DOCUMENTS

| | | | | |
|---|---|---|---|---|
| 4,337,279 A | * | 6/1982 | Polak | 427/537 |
| 4,568,562 A | * | 2/1986 | Phillips | 427/537 |
| 4,735,820 A | * | 4/1988 | Agostino et al. | 427/534 |
| 4,803,094 A | * | 2/1989 | Myers | 427/537 |
| 5,017,439 A | * | 5/1991 | Brar et al. | 427/534 |
| 5,043,299 A | | 8/1991 | Chang et al. | 437/192 |
| 5,047,115 A | | 9/1991 | Charlet et al. | |
| 5,202,008 A | | 4/1993 | Talieh et al. | 204/192.32 |
| 5,203,957 A | | 4/1993 | Yoo et al. | |

(Continued)

FOREIGN PATENT DOCUMENTS

EP          0 849 779          6/1998

(Continued)

OTHER PUBLICATIONS

Translation of JP 56-155,526 to Yamazaki "Coating Film Formation Method", Dec. 1, 1981.*

(Continued)

*Primary Examiner*—Marianne Padgett
(74) *Attorney, Agent, or Firm*—Patterson & Sheridan, LLP

(57) ABSTRACT

The present invention generally provides a method for improving fill and electrical performance of metals deposited on patterned dielectric layers. Apertures such as vias and trenches in the patterned dielectric layer are etched to enhance filling and then cleaned in the same chamber to reduce metal oxides within the aperture. The invention also provides cleaning the patterned dielectric layer in a processing chamber with a first plasma consisting essentially of argon, wherein the first plasma is generated by supplying power to a coil surrounding the processing chamber and supplying bias to a substrate support member supporting the substrate, cleaning the patterned dielectric layer in the processing chamber with a second plasma consisting essentially of hydrogen and helium, wherein the second plasma is generated by increasing the supply of power to the coil surrounding the processing chamber and reducing the supply of bias to the substrate support member supporting the substrate, depositing a barrier layer on the patterned dielectric layer after exposing the dielectric layer to the first plasma and the second plasma, and depositing a metal on the barrier layer. Furthermore, the sequential plasma treatments can be practiced in a variety of plasma processing chambers of an integrated process sequence, including pre-clean chambers, physical vapor deposition chambers, etch chambers, and other plasma processing chambers.

17 Claims, 5 Drawing Sheets

U.S. PATENT DOCUMENTS

| | | | |
|---|---|---|---|
| 5,352,636 A | 10/1994 | Beinglass | 437/235 |
| 5,660,682 A | 8/1997 | Zhao et al. | |
| 5,904,154 A | 5/1999 | Chien et al. | 134/1.2 |
| 5,906,866 A * | 5/1999 | Webb | 427/534 |
| 6,107,192 A * | 8/2000 | Subrahmanyan et al. | 438/637 |
| 6,153,530 A * | 11/2000 | Ye et al. | 438/720 |
| 6,313,042 B1 * | 11/2001 | Cohen et al. | 438/734 |
| 6,346,489 B1 * | 2/2002 | Cohen et al. | 438/789 |
| 6,372,301 B1 * | 4/2002 | Narasimhan et al. | 427/534 |
| 6,436,267 B1 * | 8/2002 | Carl et al. | 205/186 |
| 6,589,890 B1 * | 7/2003 | Cohen et al. | 438/789 |
| 6,657,304 B1 * | 12/2003 | Woo et al. | 257/758 |
| 6,693,030 B1 * | 2/2004 | Subrahmanyan et al. | 438/637 |
| 6,776,170 B1 * | 8/2004 | Liu | 134/1.1 |
| 6,797,642 B1 * | 9/2004 | Chu et al. | 438/758 |
| 6,905,965 B1 * | 6/2005 | Subrahmanyan et al. | 438/687 |
| 2001/0049192 A1 * | 12/2001 | Konecni et al. | 438/674 |
| 2004/0023485 A1 * | 2/2004 | Pan et al. | 438/637 |
| 2005/0032367 A1 * | 2/2005 | Li | 438/685 |

FOREIGN PATENT DOCUMENTS

| | | |
|---|---|---|
| EP | 1 077 476 | 2/2001 |
| GB | 2 328 692 | 3/1999 |
| JP | 56155526 | 1/1981 |
| WO | WO 99/34424 | 7/1999 |
| WO | 00/34997 | 6/2000 |

OTHER PUBLICATIONS

"Low dielectric constant films prepared by plasma-enhanced chemical vapor deposition from tetramethylsilane" by A. Grill and V. Patel, Journal of Applied Physics, vol. 85, pp. 3314-3318, Mar. 15, 1999.

"The reduction of copper oxide thin films with hydrogen plasma generated by an atmospheric-pressure glow discharge" by Sawada, et al., J. Phys D; Appl. Phys 29 (1996) 2539-2544, printed in the UK, no month.

European Search Report.

* cited by examiner

SEQUENTIAL SPUTTER AND REACTIVE PRECLEANS OF VIAS AND CONTACTS

FIELD OF THE INVENTION

The present invention generally relates to deposition of films onto a substrate. More particularly, the present invention relates to etching and cleaning of dielectric layers prior to metal deposition.

BACKGROUND OF THE RELATED ART

As feature sizes have become smaller and multilevel metallization commonplace in integrated circuits, low dielectric constant films have become increasingly important. Low dielectric constant films are particularly desirable for intermetal dielectric (IMD) layers to reduce the RC time delay of the interconnect metallization being covered, to prevent crosstalk between the different levels of metallization, and to reduce device power consumption.

Sub-half micron multilevel metallization is one of the key technologies for the next generation of very large scale integration ("VLSI"). The multilevel interconnects that lie at the heart of this technology require planarization of high aspect ratio features such as plugs and other interconnects. Reliable formation of these interconnects is very important to the success of VLSI and to the continued effort to increase circuit density and quality on individual substrates and die.

Conventional chemical vapor deposition (CVD) and physical vapor deposition (PVD) techniques are used to deposit electrically conductive material into the contact holes, vias, trenches, or other features formed on the substrate. One problem with conventional processes arises because the contact holes or other patterns often comprise high aspect ratios, i.e., the ratio of the height of the holes to their width or diameter is greater than 1. The aspect ratio of the holes increases as advances in technology yield more closely spaced features.

The presence of native oxides and other contaminants within a small feature typically results in voids in the metal deposited in the features as the native oxides and other contaminants promote uneven distribution of the depositing metal. The native oxide typically forms as a result of exposing the exposed film layer/substrate to oxygen. Oxygen exposure occurs when moving substrates in air between processing chambers at atmospheric conditions, or when a small amount of oxygen remaining in a vacuum chamber contacts the wafer/film layer, or when a layer is contaminated by etching. Other contaminants within the features can be sputtered material from an oxide over-etch, residual photoresist from a stripping process, leftover hydrocarbon or fluorinated hydrocarbon polymers from a previous oxide etch step, or redeposited material from a preclean sputter etch process. The native oxide and other contaminants create regions on the substrate which interfere with film formation, by creating regions where film growth is stunted. Regions of increased growth merge and seal the small features before regions of limited growth can be filled with the depositing metal.

The presence of native oxides and other contaminants also can increase the via/contact resistance and can reduce the electromigration resistance of small features. The contaminants can diffuse into the dielectric layer, the sublayer, or the deposited metal and alter the performance of devices which include the small features. Although contamination may be limited to a thin boundary region within the features at the interface of the deposited metal and an underlying conductive or semi-conductive feature, the thin boundary region is a substantial part of the small features. The acceptable level of contaminants in the features decreases as the features become smaller in width.

Precleaning of features using sputter etch processes is effective for reducing contaminants in large features or in small features having aspect ratios smaller than about 4:1. However, sputter etch processes can damage silicon layers by physical bombardment, sputter deposition of $Si/SiO_2$ onto sidewalls of the features, and sputter deposition of metal sublayers, such as aluminum, onto sidewalls of the features. For larger features, the sputter etch processes typically reduce the amount of contaminants within the features to acceptable levels. For small features having larger aspect ratios, sputter etch processes have not been as effective in removing contaminants within the features, thereby compromising the performance of the devices which are formed.

Referring to FIG. 1, a substrate 10 including a hole 11 formed within an electrically insulative or dielectric layer 12 thereon, such as for example, a silicon dioxide or silicon nitride layer is shown. It is difficult to deposit a uniform metal-containing layer into the high aspect ratio hole 11 because contaminants on the sidewalls 14 of the holes promote uneven deposition of the metal containing layer. The metal containing layer eventually converges across the width of the hole before it is completely filled, thus forming voids and discontinuities within the hole. Thereafter, the high mobility of metal atoms surrounding the voids causes the atoms to diffuse and minimize the surface area of the voids forming circular shaped voids as shown in FIG. 1. These voids and discontinuities result in poor and unreliable electrical contacts.

Precleaning is primarily a sputter etch type process, wherein contaminants are sputtered from the substrate. It is preferably conducted with a mixture of an inert gas, typically argon, and a reactive gas, typically hydrogen. Mixtures of argon and hydrogen remove both reactive and non-reactive contaminants and can be used to modify the shape of contact holes, vias, trenches and other patterns to improve subsequent metal deposition processes. Increasing the argon content in the preclean mixture provides a corresponding increase in the etch rate of the preclean process and a corresponding decrease in the etch uniformity of the preclean process. Hydrogen must be included in the mixture to effectively remove reactive compounds or contaminants such as hydrocarbons. Precleaning patterned substrates with a mixture of argon and any amount of hydrogen provides a lower etch rate and an increased etch non-uniformity than precleaning with argon.

A preclean process having both high concentrations of reactive gases and improved etch rates would substantially promote removal of contaminants by addition of the reactive gases.

U.S. Pat. No. 5,660,682, by Zhao et al, illustrates an attempt to combine etching and reactive cleaning of patterned dielectric layers using a plasma comprising hydrogen and argon. The argon etches deposits from apertures and the hydrogen reacts with remaining deposits to form gaseous byproducts. The combination of etching and cleaning does improve subsequent deposition of metals, however, the combined plasma processing does not prevent formation of voids in subsequent metal layers. Therefore, there remains a need for a method to improve deposition of metal layers on a patterned dielectric layer, especially apertures such as vias and trenches having an aspect ratio greater than about 1.0.

SUMMARY OF THE INVENTION

The present invention generally provides a method for improving fill and electrical performance of metals deposited on patterned dielectric layers. Apertures such as vias and trenches in the patterned dielectric layer are etched to enhance filling and then cleaned to reduce metal oxides within the aperture.

The invention also provides a process for cleaning a patterned dielectric layer in a processing chamber using a first plasma consisting essentially of argon, wherein the first plasma is generated by supplying RF plasma power to an inductive coil surrounding the processing chamber and by supplying RF bias to a substrate support member supporting the substrate. The patterned dielectric layer is cleaned in the processing chamber with a second plasma consisting essentially of hydrogen and helium, wherein the second plasma is generated by increasing the supply of RF plasma power to the inductive coil surrounding the processing chamber and reducing the supply of RF bias to the substrate support member supporting the substrate.

A barrier/liner layer may then be deposited on the patterned dielectric layer after exposing the dielectric layer to the first plasma and the second plasma, after which a metal layer may be deposited on the barrier layer. Furthermore, the sequential plasma treatments can be practiced in a variety of plasma processing chambers of an integrated process sequence, including pre-clean chambers, physical vapor deposition chambers, etch chambers, and other plasma processing chambers.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE INVENTION

Figure 1:
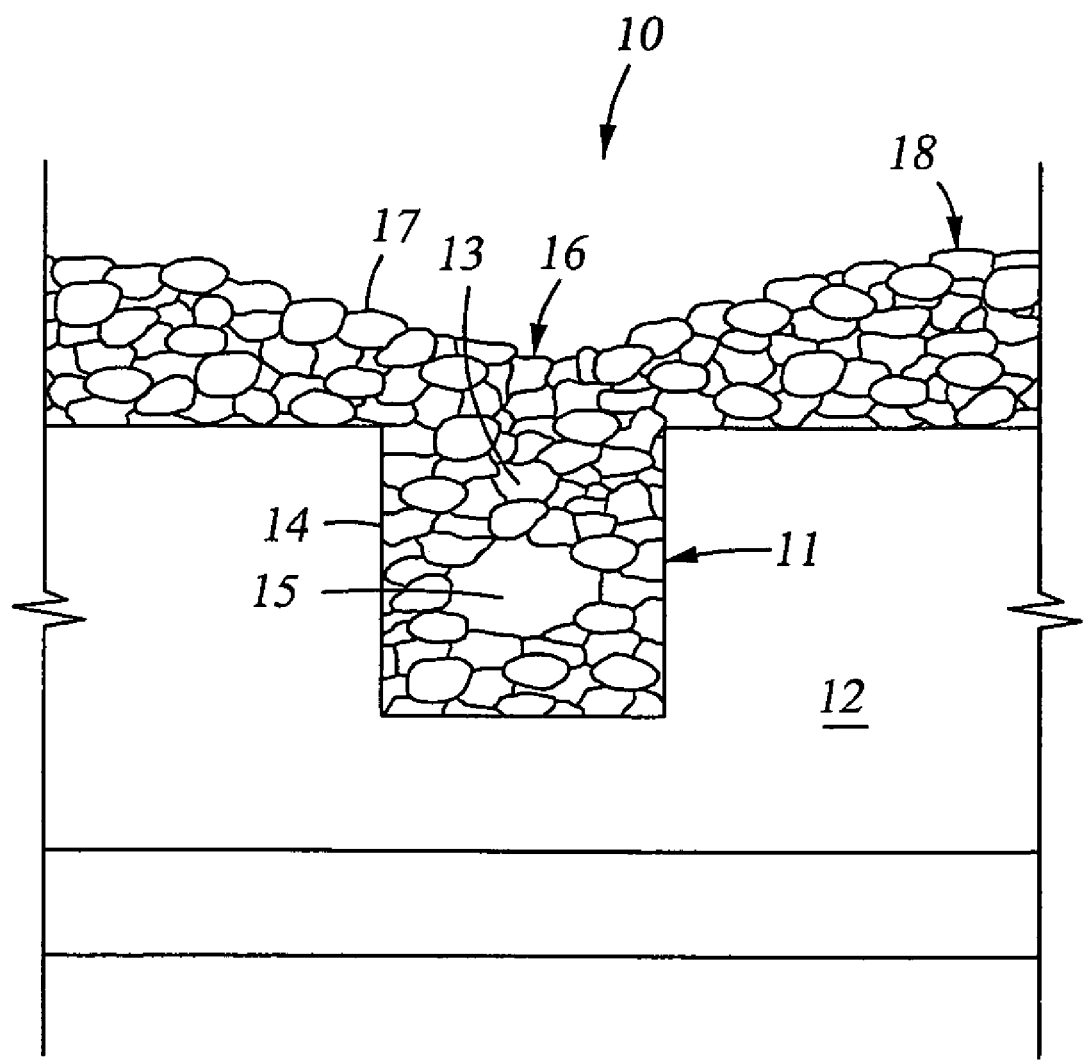
FIG. 1 is a schematic partial sectional view of a patterned substrate showing a randomly-oriented, fine-grained, granular deposition layer in a contact hole in the substrate with voids, discontinuities and a non-planar surface.

The invention provides a suitable method for precleaning vias, contacts, and other features etched into a dielectric layer, such as a silicon dioxide layer that is etched in a dry or wet etch chamber, to expose a conductive or semi-conductive sublayer, such as Ge, Si, Al, Cu, or TiN sublayers. The etch exposes the sublayer so that the feature can be filled with a conductive or semi-conductive material which connects the sublayer and a subsequent metal interconnect layer to be deposited on the dielectric layer. Etching of the features in the dielectric typically leaves contaminants which should be removed to improve filling of the features and ultimately improve the integrity and reliability of the devices formed.

Preclean by a sputter etch process is unsuitable for features with exposed metals, and is particularly unsuitable for features with exposed copper. Copper easily diffuses through dielectrics, including sidewalls of vias formed in dielectrics, destroying or compromising the integrity of the dielectric. This diffusion is especially true for TEOS, thermal oxide and some low K dielectric materials.

In one aspect, the invention provides cleaning of the patterned dielectric layer in a processing chamber with a first plasma comprising predominantly argon, and cleaning the patterned dielectric layer in the processing chamber with a second plasma consisting essentially of hydrogen and helium. After etching and cleaning, the apertures are filled with a metal which may be deposited on a barrier/liner layer. Preferably, both cleaning processes are performed in the same chamber.

After etching of the dielectric layer, the features can have damaged silicon or metal residues within the features from over-etching of the dielectric layer. The features can also contain residual photoresist on the feature surfaces from the photoresist stripping and/or ashing process or residual hydrocarbon or fluorinated hydrocarbon polymers from the dielectric etch step. The feature surfaces may also contain redeposited material generated by a sputter etch preclean process. These contaminants can migrate into the dielectric layer or can interfere with the selectivity of metallization by promoting uneven distribution of the depositing metal. The presence of the contaminants also can increase the resistance of the deposited metal by substantially narrowing the width of the feature, and thus creating a narrowed portion in the metal forming the via, contact line, or other conductive feature.

The submicron features that are cleaned and filled in accordance with the present invention, are formed by conventional techniques which deposit a dielectric material over a surface on a semiconductor substrate. Any dielectric material, whether presently known or yet to be discovered, may be used and is within the scope of the present invention, including low dielectric materials such as organic polymers and aerogels. The dielectric layer may comprise one or more distinct layers and may be deposited on any suitable deposition enhancing sublayer. The preferred deposition enhancing sublayers include conductive metals such as Al and Cu, and barrier surfaces such as TiN, Ta, and TaN.

Once deposited, the dielectric layer is etched by conventional techniques to form vias, contacts, trenches or other submicron features. The features will typically have a high aspect ratio with steep sidewalls. Etching of the dielectric layer may be accomplished with any dielectric etching process, including plasma etching. Specific techniques for etching silicon dioxide include such compounds as $C_2F_6$, $SF_6$, and $NF_3$. However, patterning may be accomplished on any layer using any method known in the art.

DETAILED DESCRIPTION OF A PREFERRED EMBODIMENT

Figure 2:
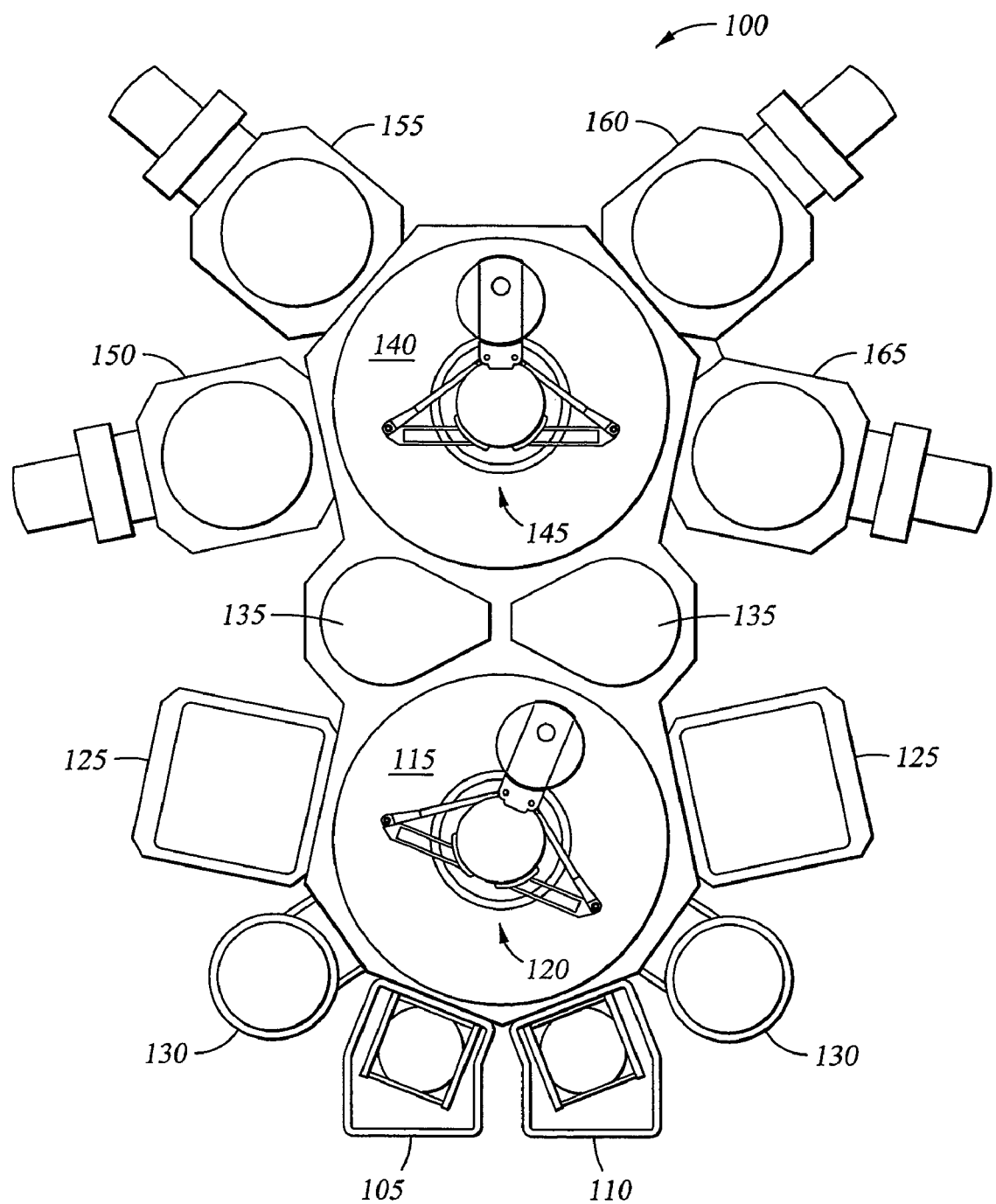
FIG. 2 is a schematic view of a cluster tool system having multiple substrate processing chambers.

FIG. 2 is a schematic view of a cluster tool system having multiple substrate processing chambers. The cluster tool system 100 includes vacuum load-lock chambers 105, 110 attached to a first stage transfer chamber 115. The load-lock chambers 105, 110 maintain vacuum conditions within the first stage transfer chamber 115 while substrates enter and exit system 100. A first robot 120 transfers substrates between the load-lock chambers 105, 110 and one or more substrate processing chambers 125 and 130 attached to the first stage transfer chamber 115. Processing chambers 125, 130 can be outfitted to perform a number of substrate processing operations such as chemical vapor deposition (CVD), physical vapor deposition (PVD), etch, pre-clean, degas, orientation and other substrate processes. The first robot 120 also transfers substrates to/from one or more transfer chambers 135 disposed between the first stage transfer chamber 115 and a second stage transfer chamber 140. The transfer chambers 135 are used to maintain ultra-high vacuum conditions in the second stage transfer chamber 140 while allowing substrates to be transferred between the first stage transfer chamber 115 and the second stage transfer chamber 140. A second robot 145 transfers substrates between the transfer chambers 135 and a plurality of substrate processing chambers 150, 155, 160 and 165.

Similar to the processing chambers 125, 130 described above, the additional processing chambers 150, 165 can be outfitted to perform a variety of substrate processing operations. For example, the processing chamber 150 is a CVD chamber outfitted to deposit a silicon oxide film; the processing chamber 155 is an etching chamber outfitted to etch apertures or opening for interconnect features; the processing chamber 160 is a PVD chamber outfitted to reactively sputter deposit a barrier film such as tantalum and/or tantalum nitride; and the processing chamber 165 is a PVD chamber outfitted to sputter deposit a conductive film, such as copper. The above listed sequence arrangement of the processing chambers is useful for practicing the present invention. A plurality of cluster tool systems may be required to perform all of the processes required to complete the interconnect portion of the manufacture of an integrated circuit or chip.

During operation, substrates are brought to vacuum load-lock chambers 105, 110 by a conveyor belt or robot system (not shown) that operates under the control of a computer program executed by a microprocessor or computer (not shown). Also, the robots 120 and 145 operate under control of the computer program to transfer substrates between the various processing chambers of the cluster tool system 100.

The above-described cluster tool system is mainly for illustrative purposes. Other plasma processing equipment, such as electron cyclotron resonance (ECR) plasma processing devices, induction-coupled RF high-density plasma processing devices or the like may be employed as part of the cluster tool system. Additionally, the method for forming a silicon oxide layer and barrier layer of the present invention is not limited to any specific apparatus or to any specific plasma excitation method.

Figure 3:
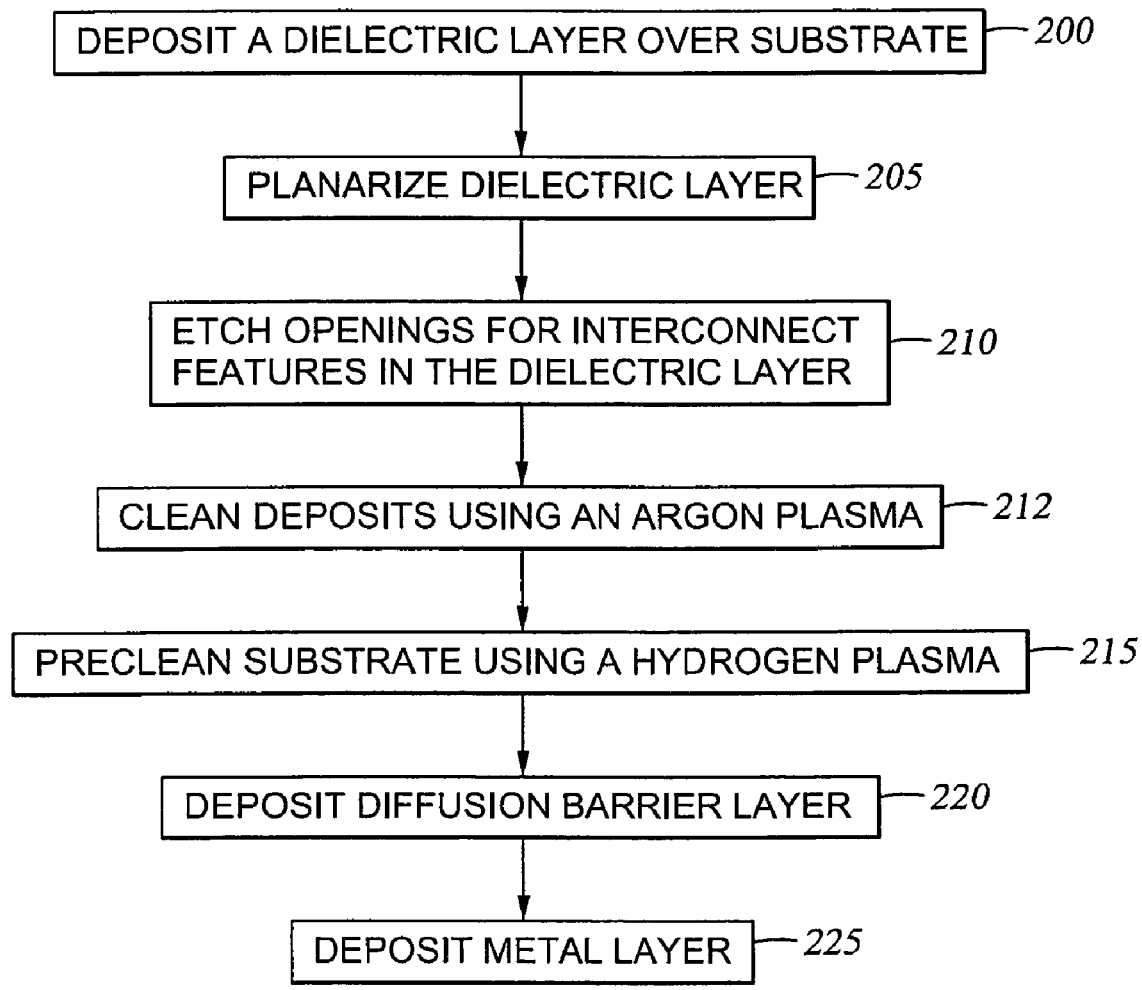
FIG. 3 is a flowchart showing a sequential argon plasma cleaning and hydrogen plasma cleaning steps of the present invention along with other process sequence steps that occur before and after the argon and hydrogen plasma steps.

FIG. 3 is a flowchart showing an argon precleaning step and a hydrogen plasma pre-cleaning step of the present invention along with other process sequence steps that occur before and after the hydrogen plasma pre-cleaning step. The steps shown in FIG. 3 can be executed in response to instructions of a computer program executed by a microprocessor or computer controller for the cluster tool system 100.

First, a dielectric layer is deposited over a substrate (step 200). The deposition of dielectric layers such as silicon oxide films can be accomplished through a variety of methods well known in the art. Preferably, the dielectric layer is deposited using a chemical vapor deposition process performed, for example, in the CVD chamber 150 as shown in FIG. 2. Before deposition of the dielectric layer, however, the substrate is typically subjected to multiple processing steps to form active devices and other structures as understood by a person of ordinary skill in the art.

Second, the dielectric layer may be planarized (step 205) in preparation for deposition of overlying layers. The planarization process can include chemical mechanical polishing (CMP), etching or other similar processes. Openings or apertures for interconnect features, such as contacts and vias, are etched in the dielectric layer (step 210). The etch processes can be carried out in a typical etch chamber, such as the etch chamber 155 as shown in the cluster tool system 100 of FIG. 2. Typically, the dielectric layer is between about 0.5 microns and about 3.0 microns thick, and the interconnect features have sub-quarter micron openings and aspect ratios (ratio of width to height) greater than 1:1. Steps 205 and 210 produces a patterned substrate having interconnect features to be metallized or filled with layers of materials.

Third, an argon plasma cleaning (step 212) according to the present invention is performed on the patterned substrate to remove deposits from prior process steps. In the argon plasma step, deposits are sputtered by an argon plasma and removed from the apertures. The argon sputter process can be performed in a variety of chambers, but is preferably performed in a pre-clean chamber. Fourth, a hydrogen plasma pre-cleaning step according to the present invention is performed on the patterned substrate. The substrate is pre-cleaned using a hydrogen plasma (step 215) to reduce copper oxide to copper and to clean and stabilize the structure of the dielectric layer. Although the pre-cleaning step can be carried out in any typical plasma processing chamber, the pre-cleaning step is preferably carried out in a pre-clean chamber. The argon plasma etch and the hydrogen plasma pre-cleaning steps according to the invention are discussed in more detail with reference to a pre-clean chamber shown in FIG. 5.

Next, a diffusion barrier layer, preferably tantalum nitride, is deposited (step 220) to prevent diffusion of silicon into an overlaying metal layer. The diffusion barrier layer also improves film adhesion between different films, such as a metal film and a silicon oxide film. The tantalum nitride layer is preferably deposited using a PVD chamber outfitted for reactive sputtering which is well known in the art. Preferably, the diffusion barrier layer has a film thickness between about 50 Å and about 200 Å.

Figure 4:
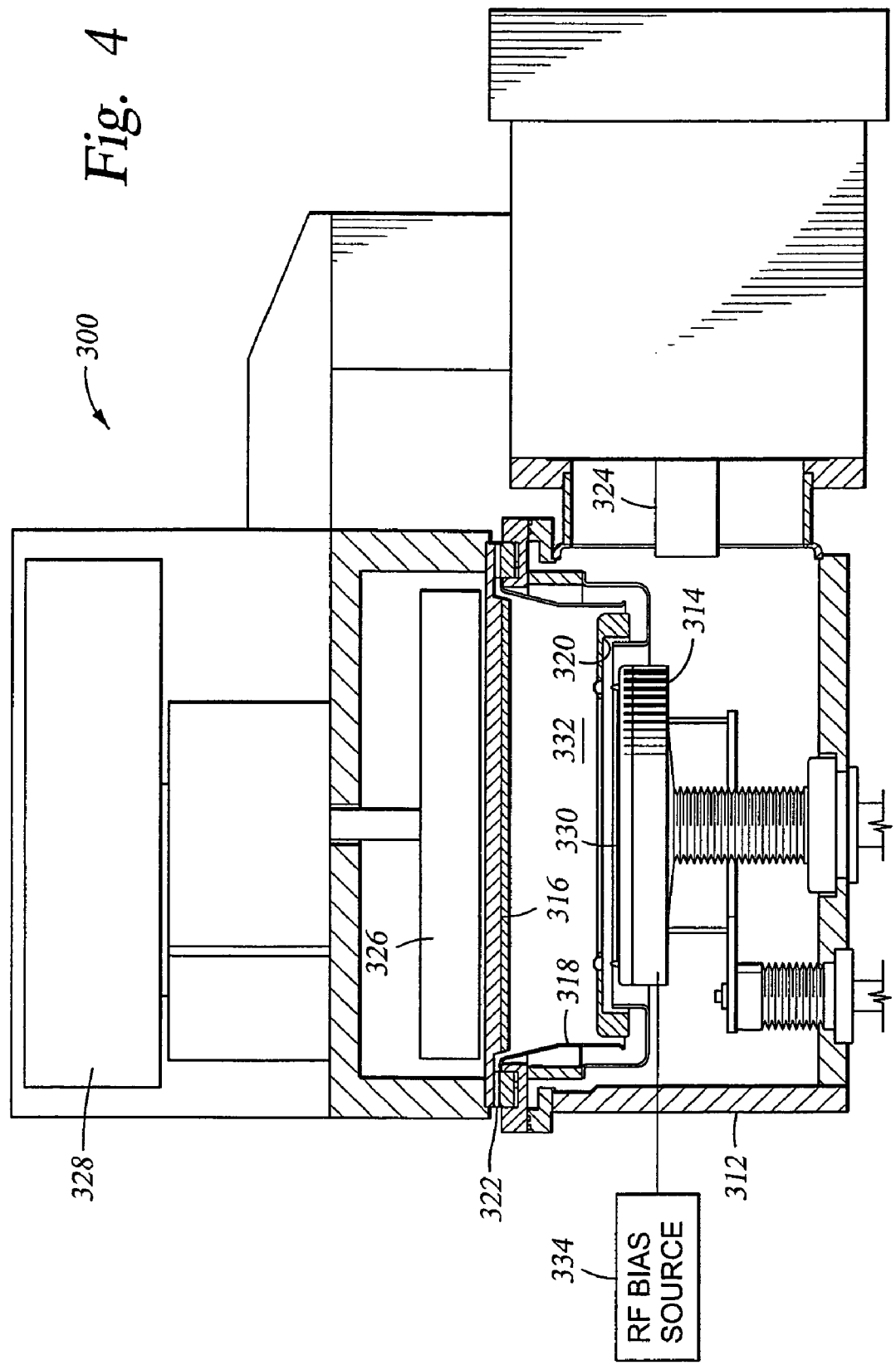
FIG. 4 is a cross sectional view of a typical PVD chamber useful for depositing a barrier layer.

FIG. 4 is a cross sectional view of a typical PVD chamber useful for depositing a barrier layer. The PVD chamber 310 generally includes a chamber enclosure 312, a substrate support member 314, a target 316, a shield 318, a clamp ring 320, a gas inlet 322, a gas exhaust 324, a magnet assembly 326, an RF plasma power source 328, and an RF bias source 334. During processing, a substrate 330 is placed on the substrate support member 314 and a processing gas is introduced through the gas inlet 322 disposed between the edge of the target and the top portion of the shield into a processing region 332 defined by the target 316, the substrate 330, and the shield 318. The RF plasma power source 328 supplies an RF power to the target to strike and maintain a plasma of the processing gas in the processing region 332 during processing while the RF bias source 334 supplies an RF bias to the substrate support member 314. The shield 318 is typically grounded during processing. During deposition, the ions in the plasma bombard the target to sputter material from the target surface. The sputtered material reacts with ions in the plasma and forms the desired film on the surface of the substrate. For deposition of a barrier film, such as tantalum/tantalum nitride, the processing gas typically comprises argon and nitrogen, wherein argon serves as the primary gas source for the plasma ions that bombard the target 316 and nitrogen primarily reacts with the sputtered atoms (tantalum) from the target 316 to form a tantalum/tantalum nitride film which is deposited onto the substrate 330. After deposition of the barrier film, the substrate is typically annealed at a temperature between about 300° C. and about 500° C. to improve the material properties of the deposited film.

Lastly, a metal layer, such as copper, is deposited over the diffusion barrier layer to complete the formation of the interconnect feature (step 225). Preferably, the metal layer is between about 6,000 Å and about 10,000 Å thick. The copper deposition can be carried out in a typical PVD chamber or a typical CVD chamber which are well known in the art. The above-described process may be repeated for multi-level integrated circuit structures.

According to the present invention, the patterned dielectric layer is pre-cleaned using an argon plasma and then a hydrogen plasma prior to the deposition of the tantalum nitride barrier layer. The pre-cleaning processes can be carried out in a variety of processing chambers, including a PVD chamber, a CVD chamber, an etch chamber and a pre-clean chamber. Preferably, the pre-cleaning process is carried out using a pre-clean chamber prior to the deposition of the tantalum nitride barrier layer. Although the invention is described using a pre-clean chamber, it is understood that the invention is applicable to a variety of processing chambers.

Figure 5:
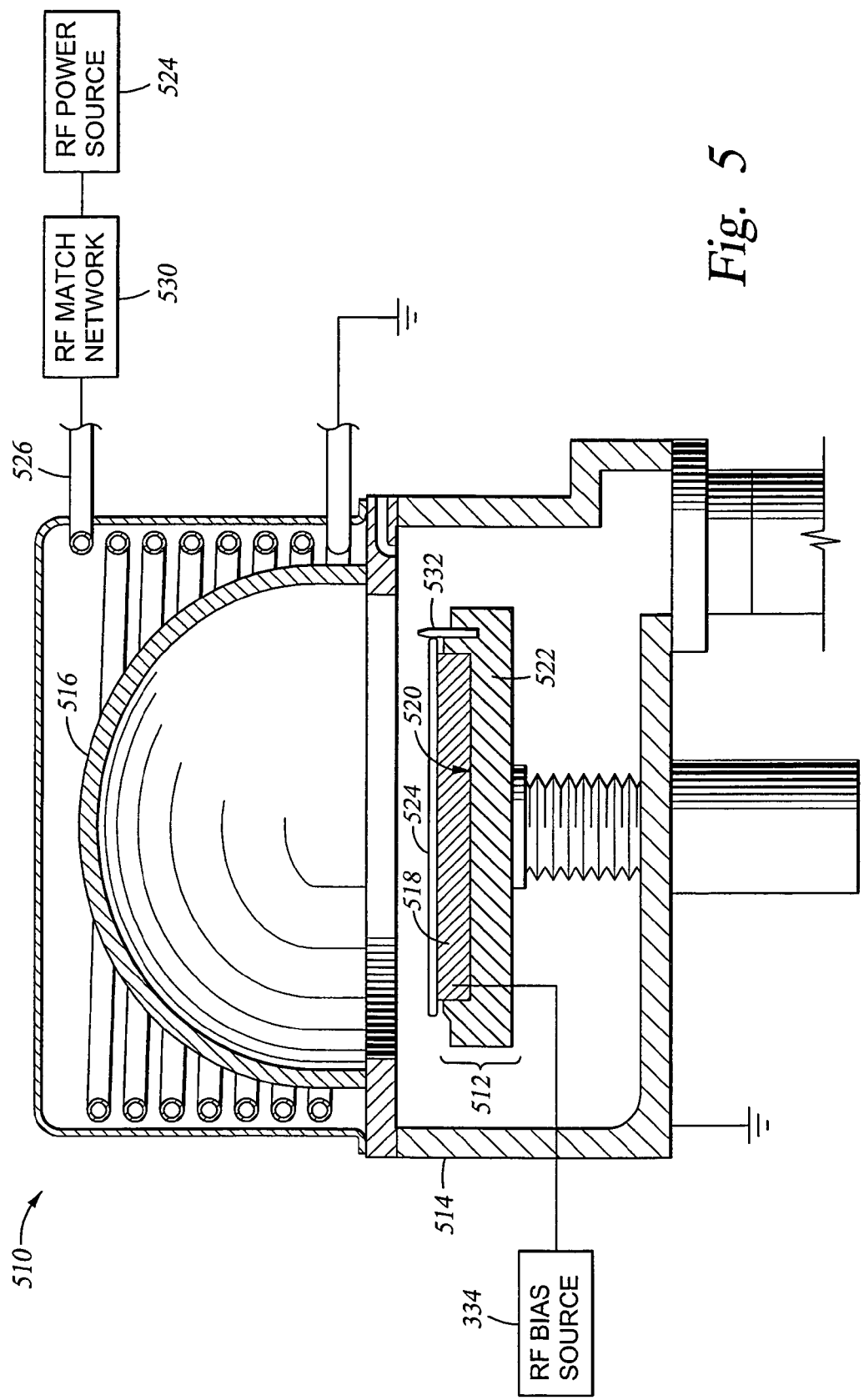
FIG. 5 is a cross sectional view of a typical pre-clean chamber useful for the present invention.

FIG. 5 is a cross sectional view of a typical pre-clean chamber useful for the present invention. An example of a pre-clean chamber useful for the present invention is the Pre-Clean II Chamber available from Applied Materials, Inc., Santa Clara, Calif. Generally, the pre-clean chamber 510 has a substrate support member 512 disposed in a chamber enclosure 514 under a quartz dome 516. The substrate support member 512 typically includes a central pedestal plate 518 disposed within a recess 520 on an insulator plate 522, typically constructed of quartz, ceramic or the like. During processing, the substrate 524 is placed on the central pedestal plate 518 and contained thereon by locating pin 532. Preferably, an RF coil 526 is disposed outside of the quartz dome 516 and connected to an RF power source 524 to strike and maintain a plasma of the process gases within the chamber. Generally, a RF match network 530 is provided to match the RF power source 524 and the RF coil 526. Typically, the substrate support member 512 is connected to an RF bias source 528 that provides a bias to the substrate support member 512. The RF power source 524 preferably provides up to about 500 W of 2 MHz RF power to the coil 526 and the RF bias source 528 preferably provides up to about 500 W of 13.56 MHz RF bias to the substrate support member 512.

According to the invention, the patterned or etched substrate is preferably pre-cleaned using first an argon plasma and then a hydrogen plasma in the pre-clean chamber prior to the deposition of a barrier layer. Preferably, the substrate is transferred into the pre-clean chamber after the dielectric layer has been planarized and the openings of the interconnect features have been formed. The pattern etching of the substrate may be processed in another processing platform or system before the substrate is transferred to a processing platform or system having a pre-clean chamber. Once the substrate is positioned for processing in the pre-clean chamber, a processing gas comprising predominantly argon, i.e., greater than about 50% argon by number of atoms, is introduced into the processing region at a pressure of preferably about 0.8 mtorr. A plasma of the argon gas is struck in the processing region to subject the substrate to an argon sputter cleaning environment. The argon plasma is preferably generated by applying between about 50 W and about 500 W of RF power from the RF power source 524 to the RF coil 526 and between about 50 W and about 500 W of RF bias from the RF bias source 528 to the substrate support member 512. The argon plasma is maintained for between about 10 seconds and about 300 seconds to provide sufficient cleaning time for the deposits that are not readily removed by a reactive hydrogen plasma. The argon plasma is preferably generated by about 300 W RF power applied to the coil and about 300 W RF bias applied to the substrate support member, and preferably is maintained for about 60 seconds.

Following the argon plasma, the chamber pressure is increased to about 80 mtorr, and a processing gas consisting essentially of hydrogen and helium, comprising between about 5% and about 100% hydrogen by number of atoms, is introduced into the processing region. Preferably, the processing gas comprises about 5% hydrogen and about 95% helium. A plasma of the hydrogen/helium gas is struck in the processing region to subject the substrate to a reactive hydrogen plasma environment. The hydrogen plasma is generated by applying between about 50 W and about 500 W power from the RF power source 524 to the RF coil 526 and between about 5 W and about 300 W of RF bias from the RF bias source 528 to the substrate support member 512. The hydrogen plasma is maintained for between about 10 seconds and about 300 seconds to reduce copper oxide to copper and to clean the substrate. The hydrogen plasma is preferably generated by about 450 W RF power applied to the coil and about 10 W RF bias applied to the substrate support member, and preferably is maintained for about 60 seconds. Once the pre-cleaning process is completed, the pre-clean chamber is evacuated to exhaust the processing gas and the reacted byproducts from the pre-cleaning process. The barrier layer is then deposited over the cleaned substrate, and the remaining processes outlined in FIG. 3 are then carried out.

While the foregoing is directed to the preferred embodiment of the present invention, other and further embodiments of the invention may be devised without departing from the basic scope thereof. The scope of the invention is determined by the claims which follow.

We claim:

1. A method for improving metal deposition on a patterned dielectric layer, comprising:
   a) cleaning the patterned dielectric layer in a processing chamber with a first plasma consisting essentially of argon;
   b) cleaning the patterned dielectric layer in the processing chamber with a second plasma consisting essentially of hydrogen and helium after cleaning the patterned dielectric layer with the first plasma; and
   c) depositing a metal on the patterned dielectric layer after exposing the dielectric layer to the first plasma and the second plasma.

2. The method of claim 1, wherein the second plasma consists essentially of about 5% hydrogen by number of atoms and about 95% helium by number of atoms.

3. The method of claim 1, wherein the patterned dielectric layer comprises one or more features having an aspect ratio greater than 1:1.

4. A method for improving metal deposition on a patterned dielectric layer on a substrate, comprising:
   a) cleaning the patterned dielectric layer in a processing chamber with a first plasma consisting essentially of argon, wherein the first plasma is generated by supplying a RF power to a coil surrounding the processing chamber and supplying a RF power to bias a substrate support member supporting the substrate;
   b) cleaning the patterned dielectric layer in the processing chamber with a second plasma consisting essentially of hydrogen and helium after cleaning the patterned dielectric layer with the first plasma, wherein the second plasma is generated by supplying the RF power to the coil surrounding the processing chamber and supplying the RF power to bias the substrate support member supporting the substrate; and
   c) depositing a metal layer after exposing the dielectric layer to the first plasma and the second plasma.

5. The method of claim 4, wherein the second plasma consists essentially of about 5% hydrogen by number of atoms and about 95% helium by number of atoms.

6. The method of claim 4, further comprising depositing a barrier layer prior to depositing the metal layer.

7. The method of claim 4, wherein the RF power supplied to bias the substrate support member and generate the second plasma is less than the RF power supplied to bias the substrate support member and generate the first plasma.

8. The method of claim 4, wherein the first plasma is generated with about 300 W of the RF power supplied to the coil and about 300 W of the RF power supplied to bias the substrate support member, and the second plasma is generated with about 450 W of the RF power supplied to the coil and about 10 W of the RF power supplied to bias the substrate support member.

9. The method of claim 4, wherein each of the first plasma and the second plasma are maintained in the processing chamber for about 60 seconds.

10. The method of claim 4, wherein the patterned dielectric layer comprises one or more features having an aspect ratio greater than 1:1.

11. A method for improving metal deposition on a patterned dielectric layer on a substrate, comprising:
   a) cleaning the patterned dielectric layer in a processing chamber with a first plasma consisting essentially of argon, wherein the first plasma is generated by supplying a RF power to a coil surrounding the processing chamber and supplying a RF power to bias a substrate support member supporting the substrate;
   b) cleaning the patterned dielectric layer in the processing chamber with a second plasma consisting essentially of hydrogen and helium after cleaning the patterned dielectric layer with the first plasma, wherein the second plasma is generated by increasing the supply of the RF power to the coil surrounding the processing chamber and reducing the supply of the RF power to bias the substrate support member supporting the substrate;
   c) depositing a barrier layer on the patterned dielectric layer after exposing the dielectric layer to the first plasma and the second plasma; and
   d) depositing a metal on the barrier layer.

12. The method of claim 11, wherein the second plasma consists essentially of about 5% of hydrogen by number of atoms and about 95% of helium by number of atoms.

13. The method of claim 11, wherein the first plasma is generated with about 300 W of the RF power supplied to the coil and about 300 W of the RF power supplied to bias the substrate support member, and the second plasma is generated with about 450 W of the RF power supplied to the coil and about 10 W of the RF power supplied to bias the substrate support member.

14. The method of claim 11, wherein each of the first plasma and the second plasma are maintained in the processing chamber for about 60 seconds.

15. The method of claim 11, wherein the first plasma is generated at about 0.8 mtorr, and the second plasma is generated at about 80 mtorr.

16. The method of claim 11, wherein the patterned dielectric layer comprises one or more features having an aspect ratio greater than 1:1.

17. A method for improving metal deposition on a patterned dielectric layer, comprising:
   a) patterning a dielectric layer in a processing chamber to form one or more features having an aspect ratio greater than 1:1;
   b) cleaning the patterned dielectric layer in the processing chamber with a first plasma consisting essentially of argon;
   c) cleaning the patterned dielectric layer in the processing chamber with a second plasma comprising about 5% hydrogen by number of atoms and 95% helium by number of atoms after cleaning the patterned dielectric layer with the first plasma; and
   d) depositing a metal on the patterned dielectric layer after exposing the dielectric layer to the first plasma and the second plasma.

* * * * *